United States Patent
You

(10) Patent No.: US 12,317,643 B2
(45) Date of Patent: May 27, 2025

(54) FLAT BONDING METHOD OF LIGHT EMITTING DEVICE AND FLAT BONDER FOR LIGHT EMITTING DEVICE

(71) Applicant: SEOUL VIOSYS CO., LTD., Ansan-si (KR)

(72) Inventor: Ik Kyu You, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 18/514,969

(22) Filed: Nov. 20, 2023

(65) Prior Publication Data
US 2024/0088321 A1 Mar. 14, 2024

Related U.S. Application Data

(63) Continuation of application No. 17/133,657, filed on Dec. 24, 2020, now Pat. No. 11,848,398.

(60) Provisional application No. 62/954,609, filed on Dec. 29, 2019.

(51) Int. Cl.
| H10H 20/01 | (2025.01) |
| H01L 21/66 | (2006.01) |
| H01L 25/075 | (2006.01) |
| H10H 20/857 | (2025.01) |

(52) U.S. Cl.
CPC ............ *H10H 20/01* (2025.01); *H01L 22/12* (2013.01); *H01L 25/0753* (2013.01); *H10H 20/857* (2025.01); *H10H 20/0364* (2025.01)

(58) Field of Classification Search
CPC ... H01L 33/005; H01L 22/12; H01L 25/0753; H10H 20/01
See application file for complete search history.

(56) References Cited

U.S. PATENT DOCUMENTS

| 7,057,212 B2 | 6/2006 | Kim et al. | |
| 8,247,833 B2* | 8/2012 | Shen | H01L 33/62 |
| | | | 257/432 |
| 9,640,507 B2 | 5/2017 | Han et al. | |
| 10,497,665 B2 | 12/2019 | Ahn | |
| 2012/0132946 A1* | 5/2012 | Park | H01L 33/44 |
| | | | 257/E33.072 |
| 2013/0157412 A1 | 6/2013 | Yu et al. | |
| 2014/0340302 A1* | 11/2014 | Sengupta | G06F 3/042 |
| | | | 29/428 |
| 2021/0193730 A1* | 6/2021 | Armitage | H01L 33/0075 |

(Continued)

FOREIGN PATENT DOCUMENTS

| KR | 10-2005-0076140 | 7/2005 |
| KR | 10-2015-0022223 | 3/2015 |
| KR | 10-1890934 | 8/2018 |

(Continued)

OTHER PUBLICATIONS

International Search Report dated Apr. 26, 2021 in International Application No. PCT/KR2020/019191 (with English translation).

*Primary Examiner* — Ratisha Mehta
(74) *Attorney, Agent, or Firm* — Oblon, McClelland, Maier & Neustadt, L.L.P.

(57) ABSTRACT

A flat bonding method of light emitting devices including bonding light emitting devices on a circuit board using a reflow process, and re-bonding at least a portion of the light emitting devices bonded on the circuit board using a press plate while pressing the portion of the light emitting devices.

20 Claims, 7 Drawing Sheets

(56) References Cited

U.S. PATENT DOCUMENTS

2022/0139890 A1* 5/2022 Lin .................... H01L 25/0753
257/79

FOREIGN PATENT DOCUMENTS

| KR | 10/-2018-0137887 | 12/2018 |
| KR | 10-2019-0076929 | 7/2019 |

* cited by examiner

FLAT BONDING METHOD OF LIGHT EMITTING DEVICE AND FLAT BONDER FOR LIGHT EMITTING DEVICE

CROSS REFERENCE TO RELATED APPLICATION

This application is a Continuation of U.S. patent application Ser. No. 17/133,657 filed Dec. 24, 2020, and claims the benefit of U.S. Provisional Patent Application No. 62/954,609 filed on Dec. 29, 2019, which is hereby incorporated by reference for all purposes as if fully set forth herein.

BACKGROUND

Field

Exemplary embodiments of the invention relate generally to a bonding method of light emitting devices and a bonder, and more particularly, to a flat bonding method of light emitting devices and a flat bonder for light emitting devices.

Discussion of the Background

As an inorganic light source, light emitting diodes have been used in various fields including displays, vehicular lamps, general lighting, and the like. With various advantages of light emitting diodes over conventional light sources, such as longer lifespan, lower power consumption, and rapid response, light emitting diodes have been replacing conventional light sources.

Light emitting diodes have been generally used as backlight light sources in display apparatuses. However, LED display apparatuses that directly display implement an image using small-sized light emitting diodes have been recently developed.

In general, a display apparatus realizes various colors through mixture of blue, green, and red light. In order to display various images, the display apparatus includes a plurality of pixels each including sub-pixels corresponding to blue, green, and red light, respectively. In this manner, a color of a certain pixel is determined based on the colors of the sub-pixels so that images can be displayed through combination of such pixels.

LEDs can emit light of various colors depending on their materials, and a display apparatus may be provided by arranging individual light emitting diodes emitting blue, green, and red on a two-dimensional plane, or by arranging light emitting diodes having a stacked structure, in which a blue LED, a green LED, and a red LED are stacked one above another, on a two-dimensional plane.

The number of light emitting diodes used in one display apparatus is usually more than 100,000, or more than one million even for a small-sized display. When bonding such a large number of light emitting devices to a circuit board, it is difficult to flatten upper surfaces of the light emitting devices, and accordingly, color irregularities are likely to occur on an image. More particularly, the upper surfaces of the bonded light emitting devices may be inclined when an amount of solder used to bond the light emitting devices are not precisely controlled, or due to a temperature difference for each solder location. As such, directions of light emitted from the light emitting devices may be changed, thereby causing color irregularities.

When the number of light emitting devices with the inclined upper surfaces is large, it is very difficult to individually repair them.

The above information disclosed in this Background section is only for understanding of the background of the inventive concepts, and, therefore, it may contain information that does not constitute prior art.

SUMMARY

Flat bonders and flat bonding methods of light emitting devices according to exemplary embodiments of the invention are capable of evenly forming upper surfaces of light emitting devices.

Exemplary embodiments also provide a flat bonding method of light emitting devices capable of easily repairing light emitting devices having inclined upper surfaces and a flat bonder for light emitting devices having the same.

Additional features of the inventive concepts will be set forth in the description which follows, and in part will be apparent from the description, or may be learned by practice of the inventive concepts.

A flat bonding method of light emitting devices according to an exemplary embodiment includes bonding light emitting devices on a circuit board using a reflow process, and re-bonding at least a portion of the light emitting devices bonded on the circuit board using a press plate while pressing the portion of the light emitting devices.

A direction of upper surfaces of the light emitting devices may be changed by the press plate while re-bonding.

The press plate may cover a plurality of light emitting devices disposed on the circuit board.

The light emitting devices on the circuit board may be re-bonded by moving the press plate in a stepper manner.

The flat bonding method may further include inspecting a bonding state of the light emitting devices on the circuit board to detect bonding failures before re-bonding, in which only the light emitting devices having the bonding failures may be re-bonded while being pressed using the press plate.

The light emitting devices may be self-arranged during the reflow process.

Each of the light emitting devices may include a substrate.

A metal bonding layer may be formed between the circuit board and the light emitting devices by the reflow process, and at least a portion of the metal bonding layer may be melted during the re-bonding process.

The press plate may apply heat to the light emitting devices to melt at least the portion of the metal bonding layer.

A display panel according to another exemplary embodiment includes a circuit board facing a first direction and including pads, light emitting devices mounted on the circuit board and including a substrate, and metal bonding layers bonding the pads to the light emitting devices, in which the substrate is disposed on an opposite side of the circuit board and is configured to transmit light generated by the light emitting device, and an angular difference between a planar direction of an upper surface of the light emitting device and the first direction is less than 5 degrees in at least 50% of the light emitting devices.

The angular difference may be less than 5 degrees in at least 95% of the light emitting devices.

A difference between an elevation of the highest upper surface and that of a next highest upper surface among the upper surfaces of the light emitting devices may be less than 1 μm.

A deviation in elevations of upper surfaces of the light emitting devices may be in a range of about 2 μm in at least 50% of the light emitting devices.

The deviation may be in a range of about 2 μm in at least 90% of the light emitting devices.

The metal bonding layers may protrude outside of the ends of the light emitting devices.

A flat bonder for light emitting devices according to yet another exemplary embodiment includes a stage to mount a circuit board to which the light emitting devices are bonded, a header disposed over the stage, and a press plate mounted on the header and configured to press the light emitting devices against the stage, in which the flat bonder is configured to change a planar direction of upper surfaces of the light emitting devices bonded on the circuit board by a reflow process.

The stage may have movable in the lateral direction in a stepper manner.

The header may be configured to move the press plate upwards and downwards.

The stage and the press plate may include a heating device, respectively.

The flat bonder may further include a chamber accommodating the stage, the header, and the press plate, in which the chamber may have an $N_2$ gas atmosphere.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
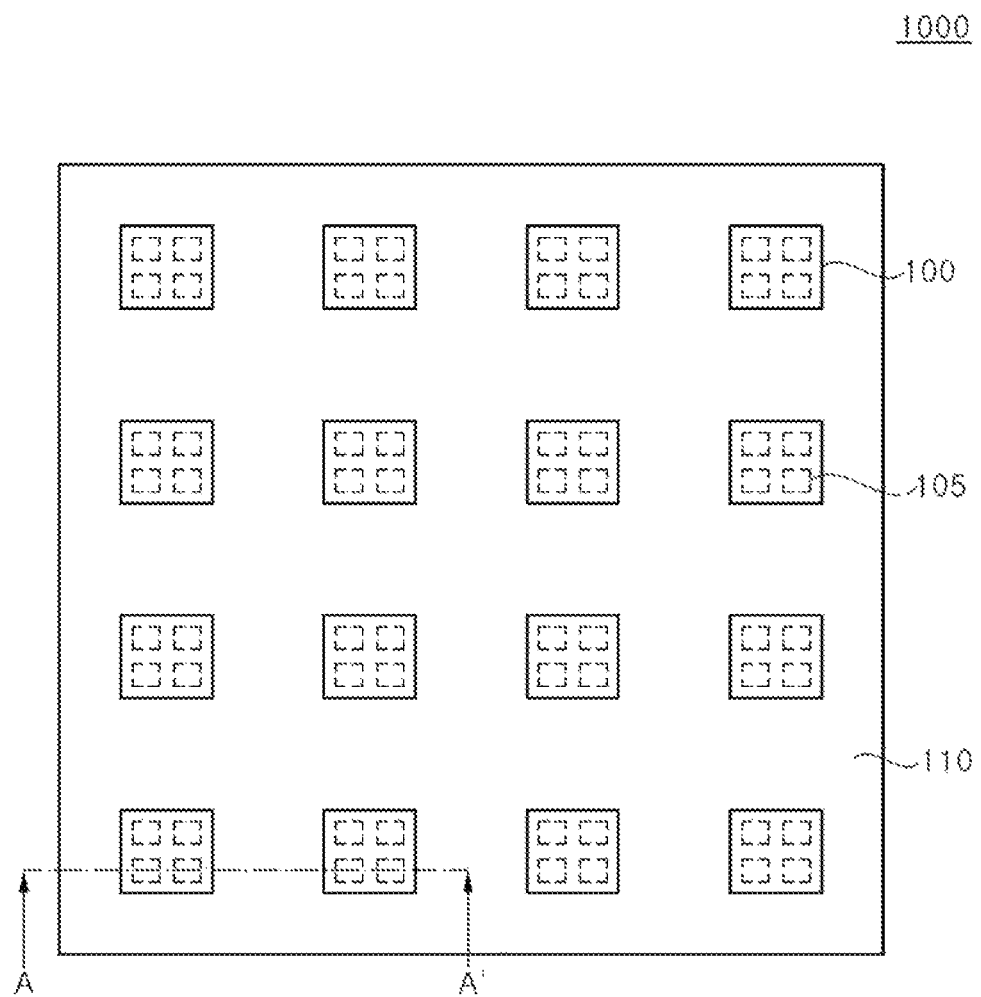
FIG. 1 is a schematic plan view of a display panel according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the inventive concepts will be described in detail with reference to the accompanying drawings.

Figure 2:
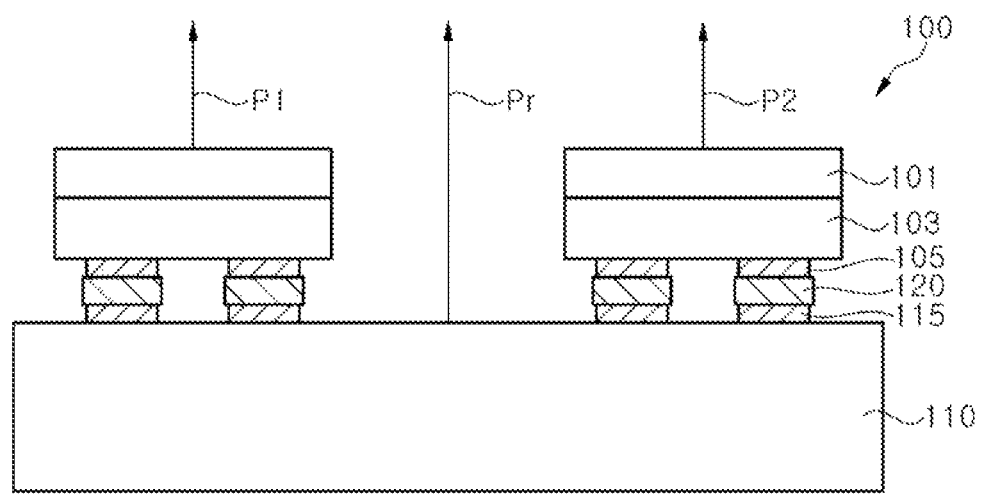
FIG. 2 is an enlarged schematic partial cross-sectional view taken along line A-A' of FIG. 1.

FIG. 1 is a schematic plan view of a display panel 1000 according to an exemplary embodiment, and FIG. 2 is an enlarged schematic partial cross-sectional view taken along line A-A' of FIG. 1.

A light emitting device 100 according to an exemplary embodiment may be used in a digital display apparatus, such as signage, and may also be used in a VR display apparatus such as a smart watch, a VR headset, or an AR display apparatus such as augmented reality glasses. However, the inventive concepts are not limited thereto, and may be used in various display devices. The display panel 1000 for displaying an image is mounted in the display apparatus.

Referring to FIGS. 1 and 2, the display panel 1000 includes a circuit board 110 and the light emitting devices 100. As used herein, the light emitting device 100 may be a small-sized LED. For example, the light emitting device 100 may have a size less than 500 μm×500 μm, and further, less than 200 μm×200 μm. In some exemplary embodiments, the light emitting device 100 may have a size of 100 μm×100 μm or 80 μm×120 μm. However, the inventive concepts are not limited to a particular size of the light emitting device 100.

The circuit board 110 may include a circuit for passive matrix driving or active matrix driving. In an exemplary embodiment, the circuit board 110 may include interconnection lines and resistors therein. In another exemplary embodiment, the circuit board 110 may include interconnection lines, transistors, and capacitors. The circuit board 110 may also have pads disposed on an upper surface thereof to allow electrical connection to the circuit therein.

A plurality of light emitting devices 100 is arranged on the circuit board 110. In an exemplary embodiment, an interval between the light emitting devices 100 may be greater than a width of at least one light emitting device 100. However, the inventive concepts are not limited thereto, and the interval between the light emitting devices 100 may be less than or equal to the width of one light emitting device 100 in other exemplary embodiments.

In an exemplary embodiment, the light emitting devices 100 may be sub-pixels that emit light of a specific color, and these sub-pixels may form one pixel. For example, a blue LED, a green LED, and a red LED may be disposed adjacent to one another to form one pixel. However, the inventive concepts are not limited thereto. In some exemplary embodiments, each of the light emitting devices 100 may have a stacked structure emitting light of various colors. For example, each of the light emitting devices 100 may have a structure in which a blue LED, a green LED, and a red LED are stacked to overlap one another, and thus, one light emitting device 100 may form one pixel.

In an exemplary embodiment, each of the light emitting devices 100 may include a substrate 101 and a light emitting structure 103. The substrate 101 may have a flat upper surface. The substrate 101 may be transparent and transmit light generated from the light emitting structure 103. The substrate 101 may be, for example, a sapphire substrate, a SiC substrate, or a GaN substrate. In an exemplary embodiment, the substrate 101 may be a growth substrate for growing an epitaxial layer that forms the light emitting structure 103.

The light emitting structure 103 may include an LED including a first conductivity type semiconductor layer, a second conductivity type semiconductor layer, and an active layer interposed therebetween. Furthermore, the light emitting structure 103 may have a stacked structure, in which a plurality of LEDs is stacked.

The light emitting device 100 may have two or more pads 105. When the light emitting device 100 includes a single active layer, the light emitting device 100 may have two pads 105. In another exemplary embodiment, when the light emitting device 100 has a structure in which a plurality of LEDs is stacked, the number of pads 105 may be more than two. For example, when the light emitting device 100 has a stacked structure including three active layers, the light emitting device 100 may have at least four pads 105.

The pads 105 may be adhered to corresponding pads 115 of the circuit board 110 through bonding layers 120. The bonding layer 120 may include, for example, a bonding material, such as AuSn, CuSn, In, or the like.

In the illustrated exemplary embodiment, upper surfaces of the light emitting devices 100, that is, an upper surface of the substrate 101 may have substantially the same planar directions P1 and P2. For example, in the display panel 1000, a maximum angular difference between planar directions defined by upper surfaces of the light emitting device 100 may be less than 10 degrees in 50% or more, further, 70% or more, furthermore, 90% or more of the light emitting devices 100. For example, when a planar direction of the circuit board 110 is defined as a reference planar direction Pr, an angular difference between a planar direction defined by an upper surface of the light emitting device 100 and the reference planar direction Pr may be less than 5 degrees in 50% or more, further, 70% or more, furthermore, 90% or more of the light emitting devices 100. A light emitting device having a planar direction that deviates more than 5 degrees from the reference planar direction Pr may have severe color irregularities on a display screen.

In addition, among the upper surfaces of the light emitting devices 100, an angular difference between a planar direction defined by the upper surface disposed at the highest elevation and the reference planar direction Pr may be 5 degrees or less.

The upper surfaces of the light emitting devices 100 may be placed at substantially the same elevation. For example, a difference (or deviation) in elevation between the upper surfaces of the light emitting devices 100 may be in a range of about 2 µm in 50% or more, further, 70% or more, further, 90% or more of the light emitting devices 100. As used herein, the elevation of the upper surface refers to an elevation of a highest portion of the upper surface of each light emitting device 100. In particular, a difference between the upper surface having the highest elevation and the upper surface having the next highest elevation among the upper surfaces of the light emitting devices 100 may be 1 µm or less. A difference between the elevations of the upper surfaces and the elevation of the highest upper surface may not exceed about 2 µm in 50% or more, further, 70% or more, further, 90% or more of the light emitting devices 100.

According to the illustrated exemplary embodiment, the upper surfaces of the light emitting devices 100 may be substantially parallel with an upper surface of the circuit board 110. As such, the display panel 1000 may prevent color irregularities. Moreover, since the upper surfaces of the light emitting devices 100 are placed at substantially the same elevation from each other, the display panel 1000 may further prevent color irregularities.

FIGS. 3, 4, 5, 6, and 7 are schematic cross-sectional views and a schematic plan view illustrating a bonding method of light emitting devices according to an exemplary embodiment.

Figure 3:
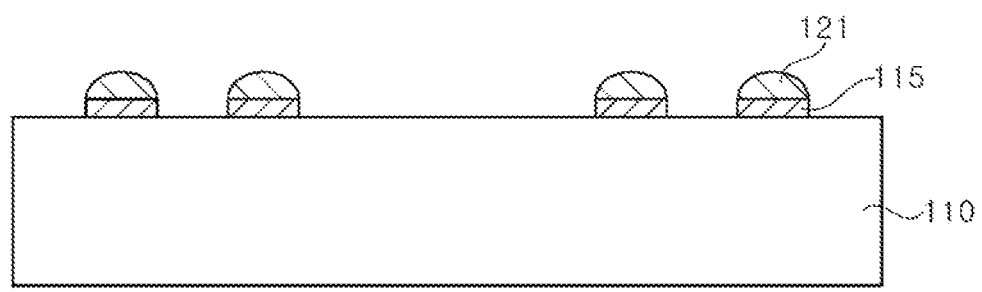
FIGS. 3, 4, 5, 6, and 7 are schematic cross-sectional views and a schematic plan view illustrating a bonding method of light emitting devices according to an exemplary embodiment.

Referring to FIG. 3, a circuit board 110 having pads 115 is provided. The circuit board 110 has circuits therein, and the pads 115 are connected to the circuits in the circuit board 110. The pads 115 are disposed in each region of the circuit board 110 where the light emitting devices 100 are to be mounted to mount a plurality of light emitting devices 100. The pads 115 may be formed of a metal layer including Au. For example, the pads 115 may have a multilayer structure of Cu/Ni/Au. Furthermore, the pads 115 may include a barrier layer for preventing solder diffusion. The barrier layer may include at least one metal among Ni, Cr, Ti, Ta, Mo, and W.

In the illustrated exemplary embodiment, the pads 115 are illustrated as protruding on the surface of the circuit board 110, but the inventive concepts are not limited thereto. In some exemplary embodiments, the pads 115 may be exposed within a region surrounded by a surface layer of the circuit board 110, and thus, the regions of the pads 115 may be recessed.

A bonding material layer 121 is provided on the pads 115. The bonding material layer 123 may include AuSn, CuSn, or In. The bonding material layer 123 may also include flux. The bonding material layer 121 may be formed by a dispensing method to release a solder paste, or may be formed by printing a solder paste using a screen printing technique such as a stencil. Screen printing technology may facilitate forming the bonding material layers 121 on a large number of pads 115. However, the amount of bonding material layers 121 disposed on the pads 115 may generally be different from each other, because it is generally very difficult to dispose the exact same amount of bonding material layers 121 on the pads 115 due to the size of the pads 115 and the method of forming the bonding material layer 121.

Figure 4:
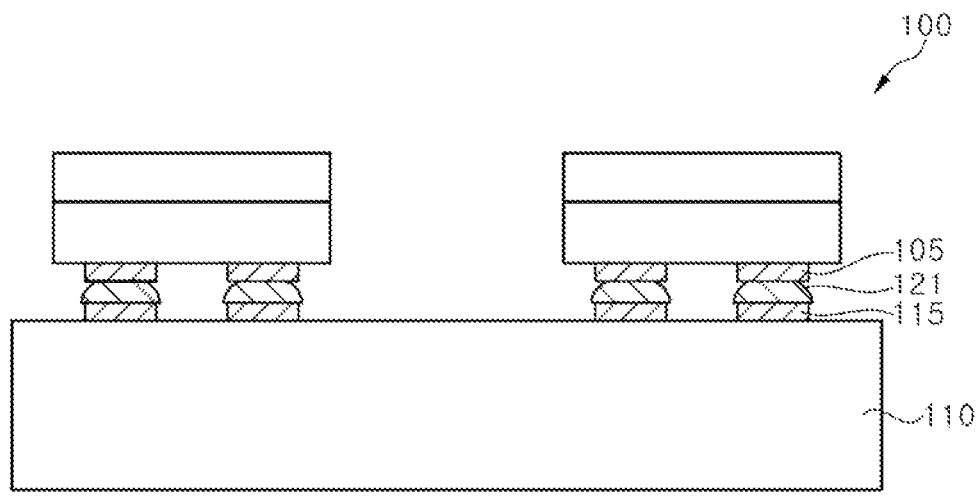

Referring to FIG. 4, the light emitting devices 100 may be surface-mounted on the circuit board 110. The light emitting devices 100 may be mounted individually or in a group on the circuit board 110. Each of the pads 105 of the light emitting devices 100 may be disposed on the bonding material layer 121 on the circuit board 110. For example, the light emitting devices 100 may be arranged on a temporary substrate and then be individually disposed on the circuit board 110 using a pickup and placing device.

Figure 5:
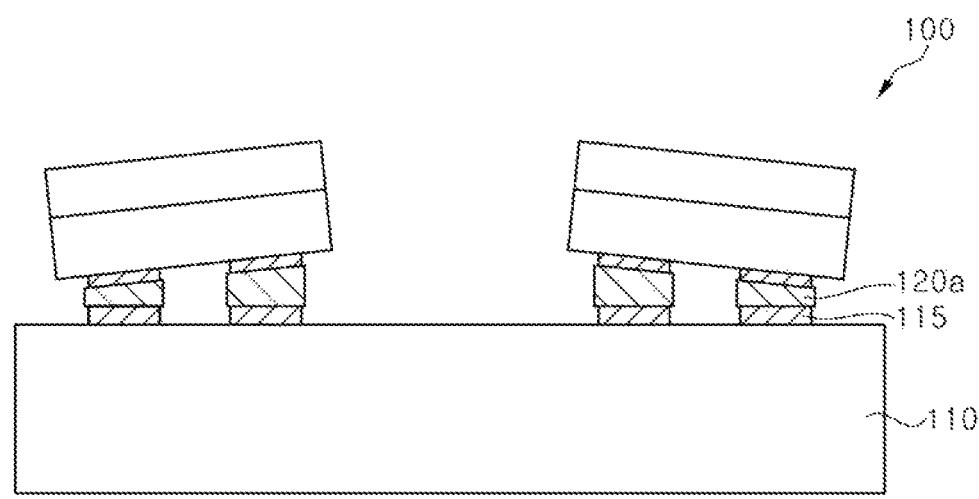

Referring to FIG. 5, the light emitting devices 100 are bonded to the circuit board 110 through a reflow process. The bonding material layers 121 may carry out eutectic bonding by the reflow process, and thus, a metal bonding layer 120a may be formed. Flux in the bonding material layers 121 may be removed by heat during an initial heating step of the reflow process.

In the illustrated exemplary embodiment, the reflow process may be carried out using a reflow soldering machine, and a heat source such as hot air infrared rays or a laser beam may be used to heat the bonding material layer 121. In addition, the process may be carried out in an $N_2$ atmosphere, and after the bonding is carried out, the elevated temperature may be cooled down using $N_2$. In this case, a peak temperature may be adjusted depending on a type of solder.

After the light emitting devices 100 are arranged on the circuit board 110, the light emitting devices 100 may be freely placed without being constrained by elements other than solder. In this case, locations of the light emitting devices 100 may be changed as the bonding material layer 121 is melted, however, the light emitting devices 100 may be self-arranged on the pads 115 of the circuit board 110 by a surface tension of the bonding material layer 121. When there are elements that restrict a change in locations of the light emitting devices 100, such as a support substrate, self-arrangement of the light emitting devices 100 may be constrained. However, in the illustrated exemplary embodiment, since a change of locations of the light emitting devices 100 are not constrained by other elements, the locations thereof may be determined using self-arrangement.

Meanwhile, since the amount of the bonding material layers 121 disposed on the pads 115 are different from each other, the upper surfaces of the light emitting devices 100, that is, the upper surface of the substrate 101 may be inclined. Inclination of the upper surface of the substrate 101 may be caused by various factors, such as uneven heating and an initial location of the light emitting device 100, as well as the bonding material layer 121.

A conventional manufacturing process of the display panel is completed when the light emitting devices 100 bonded by the reflow process. In this case, however, a plurality of light emitting devices 100 may be bonded to the display panel while being inclined, which may cause defects on a display image.

In the illustrated exemplary embodiment, the light emitting devices 100 are bonded to the circuit board 110 by carrying out the reflow process, and re-bonding is carried out to restore the light emitting devices 100 having the inclined upper surfaces to a normal location. This will be described in more detail with reference to FIG. 6.

Figure 6:
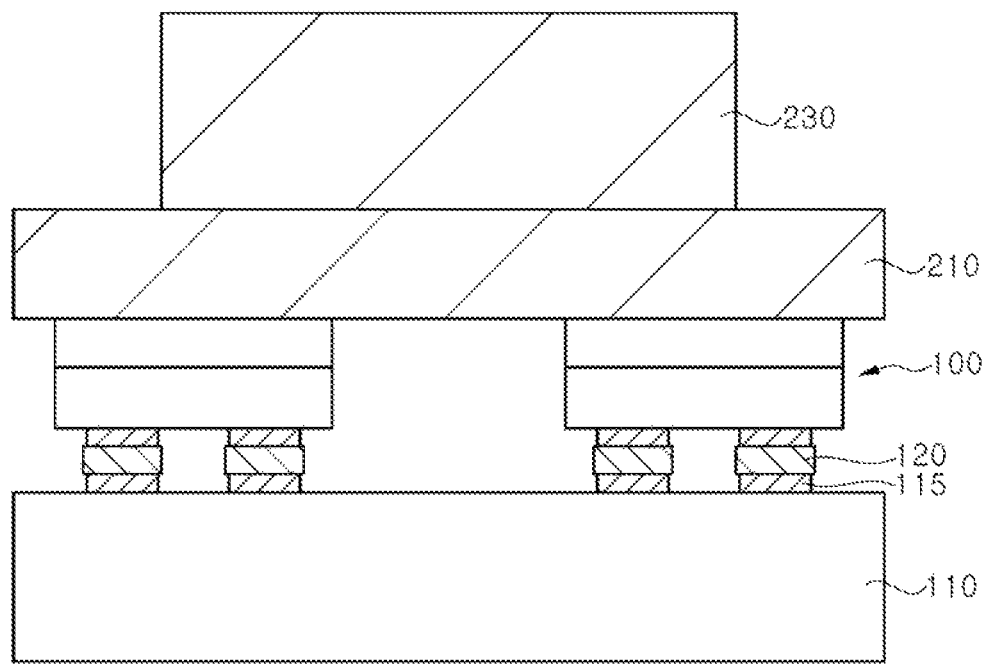

Referring to FIG. 6, as described with reference to FIG. 5, a press plate 210 is placed on the light emitting devices 100 on which the reflow process has been carried out. The press plate 210 may be attached to a header 230, and the header 230 may push the press plate 210 downward and press the light emitting devices 100 against the circuit board 110.

The press plate 210 may have a width that covers at least two light emitting devices 100. The press plate 210 may be disposed to cover the adjacent light emitting devices 100. A shape of the press plate 210 is not particularly limited as long as the upper surfaces of the plurality of light emitting devices 100 can be placed in parallel with the upper surface of the circuit board 110. In an exemplary embodiment, the press plate 210 may have a flat lower surface, and the flat lower surface may press the upper surfaces of the light emitting devices 100. In another exemplary embodiment, pins disposed at narrow intervals may be provided on the lower surface of the press plate 210. A plurality of pins may be placed on one light emitting device 100, and thus, the inclined light emitting device 100 may be changed to the normal position. In another exemplary embodiment, the press plate 210 may have a lower surface divided into a plurality of flat regions.

The press plate 210 may also include a heating device to apply heat to the light emitting devices 100. For example, a resistor may be embedded in the press plate 210 to heat the lower surface of the press plate 210, and the light emitting devices 100 may be heated through the lower surface of the press plate 210.

Heat may also be applied to the lower surface of the circuit board 110. As such, the metal bonding layer 120a formed by the reflow process may be melted again at least locally. As the light emitting devices 100 are pressed by the press plate 210 while the metal bonding layer 120a, directions of the upper surfaces of the light emitting devices 100 may be changed. In particular, as the lower surface of the press plate 210 may be placed to be in parallel with the upper surface of the circuit board 110, the directions of the upper surfaces of the light emitting devices 100 pressed by the press plate 210 may be changed in a direction parallel with the upper surface of the circuit board 110.

The metal bonding layer 120 is formed by cooling the melted metal bonding layer 120a after changing the directions of the upper surfaces of the light emitting devices 100. The metal bonding layers 120 bonding the light emitting devices 100 pressed by the press plate 210 may have a different structure than the metal bonding layers 120a formed by the reflow process. In particular, as the press plate 210 is pressed, the metal bonding layer 120 may escape to the outside of the pad 115 rather than the metal bonding layer 120a.

Meanwhile, a size of the press plate 210 may be smaller than a size of the circuit board 110. As such, the process of changing inclination angles of the light emitting devices 100 using the press plate 210 may be carried out several times.

Figure 7:
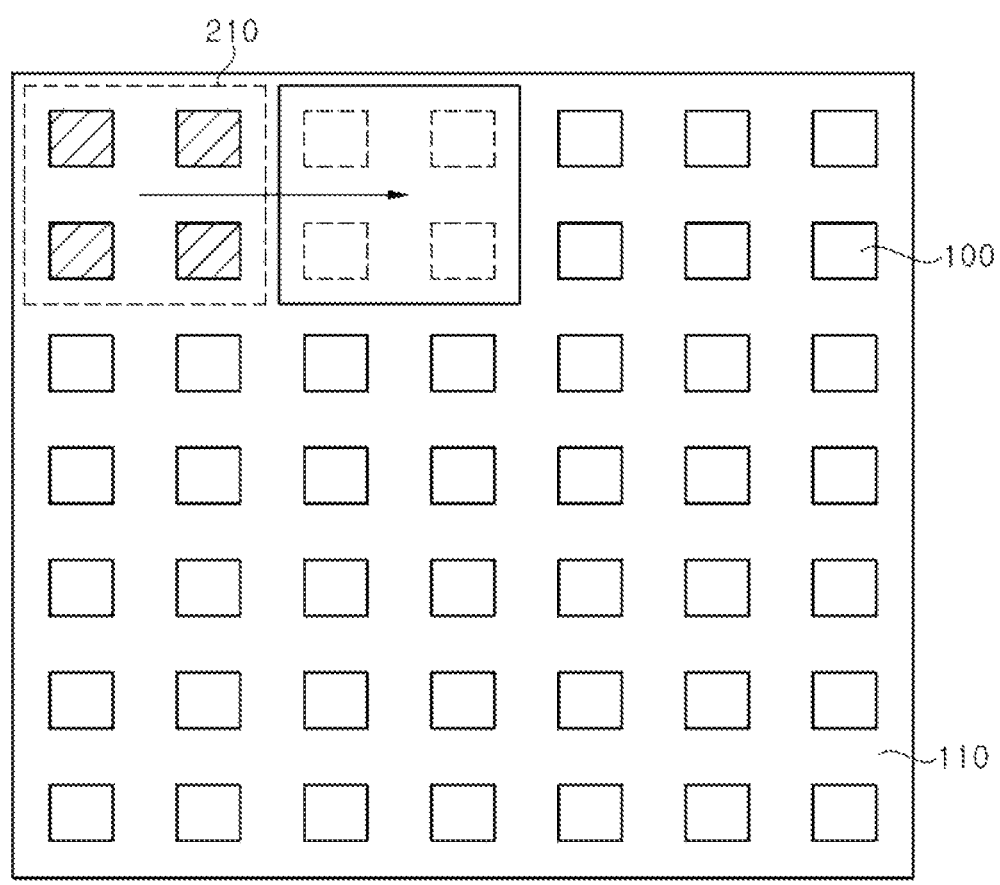

Referring to FIG. 7, when the re-bonding process is completed for a portion of the light emitting devices 100 on the circuit board 110 using the press plate 210, the press plate 210 may be moved to re-bond other light emitting devices 100.

In an exemplary embodiment, the press plate 210 may re-bond each of the light emitting devices 100 on the circuit board 110 in a stepper manner. The press plate 210 may be moved while being completely separated from the light emitting devices 100 on which the re-bonding has been carried out, and may be arranged on the other light emitting devices 100, but the inventive concepts are not limited thereto. For example, in some exemplary embodiments, the press plate 210 may be arranged to cover the portion of the light emitting devices 100 on which re-bonding has been carried out and the light emitting devices 100 on which re-bonding has not been carried out, and thereafter, re-bonding may be carried out.

In another exemplary embodiment, after the reflow process described with reference to FIG. 5 is completed, an inspection may be carried out in advance using a camera or the like to check whether bonding of the light emitting devices 100 on the circuit board 110 has failed. As such, the re-bonding process using the plate 210 may be limitedly carried out on the light emitting devices 100 having bonding failures.

According to the illustrated exemplary embodiments, the directions of the upper surfaces of the light emitting devices 100 disposed on the circuit board 110 may be changed to substantially match the direction of the circuit board 110. Further, according to the illustrated exemplary embodiments, since the light emitting devices are re-bonded after the light emitting devices are self-arranged using the reflow process, the light emitting devices 100 may be disposed at a desired location on the circuit board 110 and the directions of the upper surfaces of the light emitting devices 100 may be arranged in a direction suitable for the display.

Figure 8:
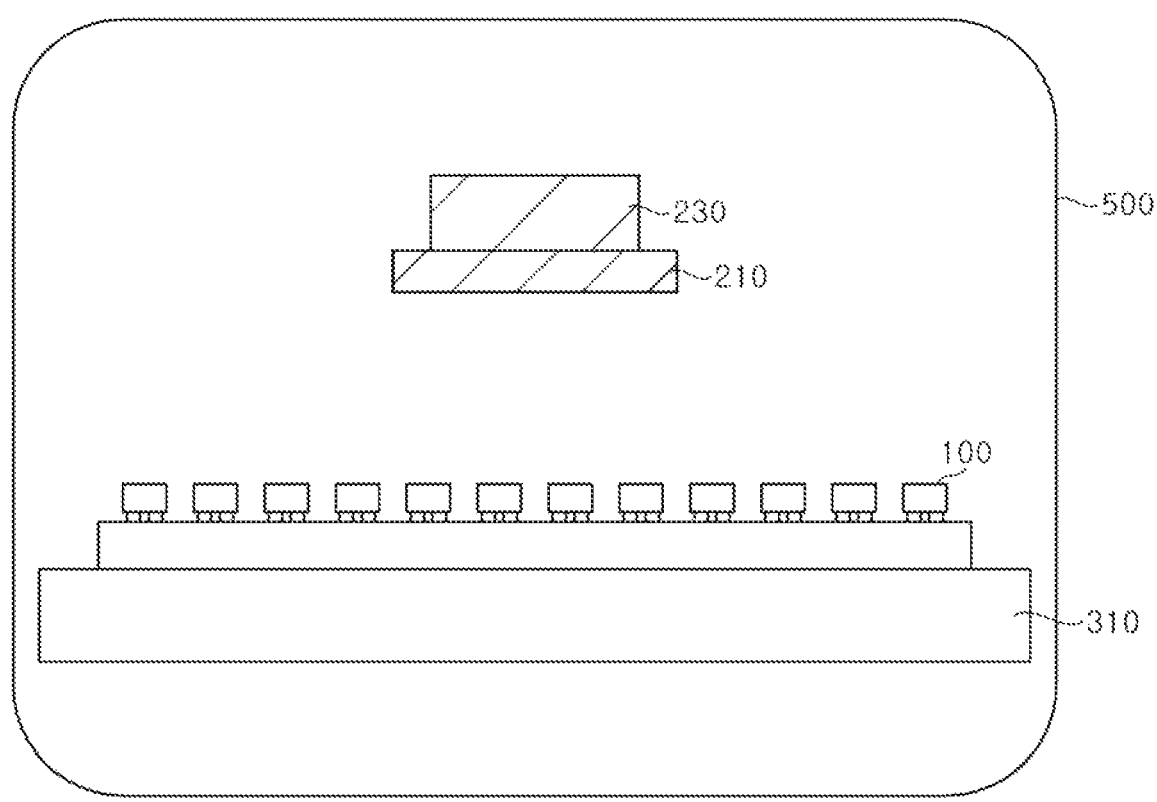
FIG. 8 is a schematic cross-sectional view of a flat bonder for light emitting devices according to an exemplary embodiment.

FIG. 8 is a schematic cross-sectional view illustrating a flat bonder for light emitting devices according to an exemplary embodiment.

Referring to FIG. 8, the flat bonder for light emitting devices may include a stage 310, a press plate 210, a header 230, and a chamber 500.

The stage 310 may provide an area to which light emitting devices 100 bonded on a circuit board 110 by a reflow process can be mounted, and may be movable in the lateral directions. The stage 310 may also be movable in the vertical direction. The stage 310 may be moved in the lateral direction in a stepper manner, such that the light emitting devices 100 to be re-bonded may be placed under the press plate 210 in the stepper manner.

The stage 310 may have a heating device, and a metal bonding layer 120a formed by a reflow process may be heated using the heating device.

The header 230 may move upward and downward to press the press plate 210 towards the light emitting devices 100. The header 230 may control an elevation of the press plate 210 with a tolerance, for example, within about 1 µm. As such, a difference between an elevation of the highest upper surface and that of the next highest upper surface among upper surfaces of the light emitting devices on the circuit board 110 may be 1 µm or less.

The press plate 210 may change directions of the upper surfaces of the light emitting devices 100 while contacting the light emitting devices 100. The press plate 210 may have a width that covers at least two light emitting devices 100. For example, the press plate 210 may have an area of 3 mm×3 mm or more. In an exemplary embodiment, the press plate 210 may have a flat lower surface, and the flat lower surface may press the upper surfaces of the light emitting devices 100. In another exemplary embodiment, pins disposed at narrow intervals may be provided on the lower surface of the press plate 210. In still another exemplary embodiment, the press plate 210 may have a lower surface divided into a plurality of flat regions. The press plate 210 may also include a heating device.

The press plate 210, the header 230, and the stage 310 may be disposed in the chamber 500. An interior of the chamber 500 may be set to be an inert gas atmosphere, for example, an $N_2$ atmosphere. Furthermore, a heating device capable of heating the interior of the chamber 500 may be mounted inside the chamber 500.

Figure 9A:
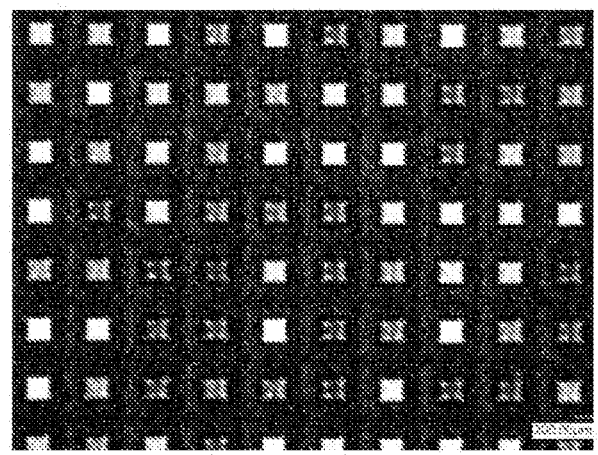
FIG. 9A is an image of a display panel manufactured according to a conventional bonding method of light emitting devices.
Figure 9B:
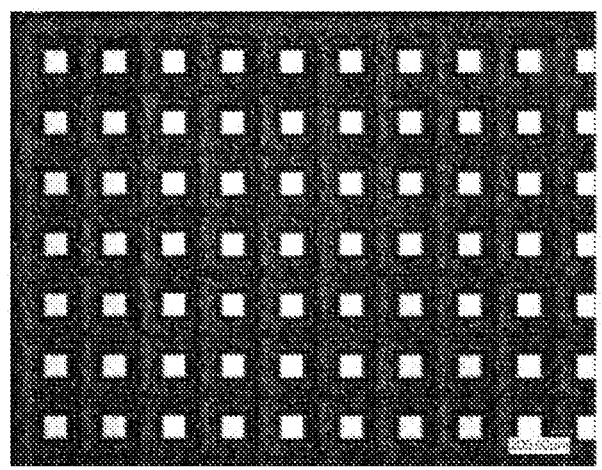
FIG. 9B is an image illustrating a display panel manufactured according to an exemplary embodiment.

FIG. 9A is an image illustrating a display panel manufactured according to a conventional bonding method of light emitting devices, and FIG. 9B is an image illustrating a display panel manufactured according to an exemplary embodiment. Light was irradiated in a direction perpendicular to a circuit board, and upper surfaces of the light emitting devices were photographed with a camera.

Referring to FIG. 9A, among the light emitting devices bonded on the circuit board by a reflow process, about 50% or more of the light emitting devices were observed to have dark upper surfaces. However, referring to FIG. 9B, the upper surfaces of the light emitting devices that were bonded on the circuit board by the reflow process and then subjected to a re-bonding process were generally observed bright. As such, it can be seen that the upper surfaces of the light emitting devices are changed evenly by re-bonding, and thus, the directions of the upper surfaces thereof are changed to be substantially parallel with that of the circuit board.

According to exemplary embodiments, directions of upper surfaces of the light emitting devices may be set uniform to substantially match a direction of an upper surface of the circuit board, thereby preventing occurrence of color defects.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting apparatus, comprising:
a circuit board extending in a planar direction and including a pad;
a first light emitter electrically connected to the pad and including a substrate and a light emission source; and
a metal layer electrically connected to the pad and the first light emitter,
wherein:
the substrate is configured to transmit light generated by the light emission source;
an angular difference between a first side surface of the substrate of the first light emitter and a perpendicular direction of the planar direction is 5 degrees or less; and
opposing distal ends of the first side surface of the substrate of the first light emitter are disposed at different distances relative to the perpendicular direction.

2. The light emitting apparatus of claim 1, further comprising a second light emitter disposed adjacent to the first light emitter.

3. The light emitting apparatus of claim 2, wherein an angular difference between a side surface of the second light emitter and a perpendicular direction of the planar direction is 5 degrees or less.

4. The light emitting apparatus of claim 2, wherein an interval between the first light emitter and the second light emitter is smaller than a width of the first light emitter.

5. The light emitting apparatus of claim 2, wherein an amount of material forming the metal layer between the first light emitter and the pad is different from an amount of material forming the metal layer between the second light emitter and the pad.

6. The light emitting apparatus of claim 1, wherein the metal layer extends outside of the distal ends of the first light emitter.

7. The light emitting apparatus of claim 2, wherein a difference in elevation between an upper surface of the first light emitter and an upper surface of the second light emitter is 1 μm or less.

8. A light emitting apparatus, comprising:
a circuit board extending in a planar direction and including a pad;
a first light emitter electrically connected to the pad and including a substrate and a light emission source; and
a metal layer electrically connected to the pad and the first light emitter,
wherein:
the substrate is configured to transmit light generated by the light emission source;
an angular difference between a first side surface of the substrate of the first light emitter and a perpendicular direction of the planar direction is 5 degrees or less; and
opposing distal ends of the first side surface of the substrate of the first light emitter are disposed at different elevations from the circuit board.

9. The light emitting apparatus of claim 8, further comprising a second light emitter disposed adjacent to the first light emitter.

10. The light emitting apparatus of claim 9, wherein an angular difference between a side surface of the second light emitter and a perpendicular direction of the planar direction is 5 degrees or less.

11. The light emitting apparatus of claim 9, wherein an interval between the first light emitter and the second light emitter is smaller than a width of the first light emitter.

12. The light emitting apparatus of claim 9, wherein an amount of material forming the metal layer between the first light emitter and the pad is different from an amount of material forming the metal layer between the second light emitter and the pad.

13. The light emitting apparatus of claim 8, wherein the metal layer extends outside of the distal ends of the first light emitter.

14. The light emitting apparatus of claim 9, wherein a difference in elevation between an upper surface of the first light emitter and an upper surface of the second light emitter is 1 μm or less.

15. A light emitting apparatus, comprising:
a circuit board extending in a planar direction and including a pad;

a first light emitter electrically connected to the pad and including a substrate and a light emitting source; and a metal layer electrically connected to the pad and the first light emitter, wherein:

the substrate is configured to transmit light generated by the light emission source;

a first side surface of the substrate of the first light emitter is disposed at an angle with respect to a perpendicular direction of the planar direction; and opposing distal ends of the first side surface of the substrate of the first light emitter are disposed at different elevations from the circuit board.

16. The light emitting apparatus of claim 15, further comprising a second light emitter disposed adjacent to the first light emitter.

17. The light emitting apparatus of claim 16, wherein an angular difference between a side surface of the second light emitter and a perpendicular direction of the planar direction is 5 degrees or less.

18. The light emitting apparatus of claim 16, wherein an interval between the first light emitter and the second light emitter is smaller than a width of the first light emitter.

19. The light emitting apparatus of claim 15, wherein the metal layer extends outside of the ends of the first light emitter.

20. The light emitting apparatus of claim 16, wherein a difference in elevation between an upper surface of the first light emitter and an upper surface of the second light emitter is 1 μm or less.

* * * * *